(12) United States Patent
Lee et al.

(10) Patent No.: US 10,103,265 B1
(45) Date of Patent: Oct. 16, 2018

(54) COMPLEMENTARY METAL OXIDE SEMICONDUCTOR DEVICE AND METHOD OF FORMING THE SAME

(71) Applicant: UNITED MICROELECTRONICS CORP., Hsin-Chu (TW)

(72) Inventors: Zhi-Cheng Lee, Tainan (TW); Kai-Lin Lee, Kinmen County (TW); Yi-Che Yen, Yunlin County (TW)

(73) Assignee: UNITED MICROELETRONICS CORP., Hsin-Chu (TW)

( * ) Notice: Subject to any disclaimer, the term of this patent is extended or adjusted under 35 U.S.C. 154(b) by 0 days.

(21) Appl. No.: 15/696,187

(22) Filed: Sep. 6, 2017

(30) Foreign Application Priority Data

Aug. 8, 2017 (CN) .......................... 2017 1 0669736

(51) Int. Cl.
| | | |
|---|---|---|
| *H01L 29/78* | (2006.01) | |
| *H01L 27/092* | (2006.01) | |
| *H01L 21/8238* | (2006.01) | |
| *H01L 21/311* | (2006.01) | |
| *H01L 21/02* | (2006.01) | |
| *H01L 21/3105* | (2006.01) | |

(52) U.S. Cl.
CPC .. *H01L 29/7849* (2013.01); *H01L 21/823821* (2013.01); *H01L 21/823864* (2013.01); *H01L 21/823871* (2013.01); *H01L 21/823878* (2013.01); *H01L 27/0924* (2013.01); *H01L 21/02271* (2013.01); *H01L 21/31053* (2013.01); *H01L 21/31111* (2013.01); *H01L 21/31144* (2013.01)

(58) Field of Classification Search
CPC ......... H01L 29/7849; H01L 21/823871; H01L 21/823878; H01L 21/823821; H01L 27/0924; H01L 21/823864; H01L 21/31053; H01L 21/02271; H01L 21/31144; H01L 21/31111
See application file for complete search history.

(56) References Cited

U.S. PATENT DOCUMENTS

| | | | | |
|---|---|---|---|---|
| 6,693,008 B1 * | 2/2004 | Sato | ................... | H01L 21/76229 438/256 |
| 9,349,837 B2 | 5/2016 | Ching | | |
| 2006/0084255 A1 * | 4/2006 | Oyu | ................... | H01L 21/28044 438/592 |
| 2006/0097293 A1 * | 5/2006 | Gaul | ....................... | H01L 29/78 257/288 |
| 2006/0121688 A1 * | 6/2006 | Ko | .................. | H01L 21/823807 438/439 |
| 2006/0125024 A1 * | 6/2006 | Ishigaki | .......... | H01L 21/823842 257/390 |
| 2007/0020858 A1 * | 1/2007 | Yang | ................... | H01L 27/0203 438/275 |

(Continued)

*Primary Examiner* — Victor A Mandala
(74) *Attorney, Agent, or Firm* — Winston Hsu

(57) ABSTRACT

A CMOS device is disclosed, including a plurality of active regions having a length along a first direction, wherein the active regions are arranged end-to-end along the first direction and are separated by an isolation structure. A recessed region is formed in the isolation structure between the adjacent terminals of the each pair of neighboring active regions and is completely filled by an interlayer dielectric layer, wherein the interlayer dielectric layer comprises a stress.

20 Claims, 8 Drawing Sheets

(56) References Cited

U.S. PATENT DOCUMENTS

| | | | |
|---|---|---|---|
| 2007/0228427 A1* | 10/2007 | Matsui | H01L 27/10852 |
| | | | 257/288 |
| 2008/0308876 A1* | 12/2008 | Lee | H01L 21/823828 |
| | | | 257/369 |
| 2013/0270620 A1 | 10/2013 | Hu | |
| 2014/0061807 A1* | 3/2014 | Deng | H01L 29/66477 |
| | | | 257/368 |
| 2017/0194190 A1* | 7/2017 | Su | H01L 21/764 |
| 2018/0006111 A1* | 1/2018 | Xie | H01L 29/66795 |

* cited by examiner

COMPLEMENTARY METAL OXIDE SEMICONDUCTOR DEVICE AND METHOD OF FORMING THE SAME

BACKGROUND OF THE INVENTION

1. Field of the Invention

The invention generally related to a complementary metal oxide semiconductor (CMOS) device and method of forming the same. More particular, the invention related to a CMOS device having an interlayer dielectric layer with inherent stress and method of forming the same.

2. Description of the Prior Art

In advanced semiconductor technology, fin field effect transistors (Fin FET) have taken the place of traditional planar transistors and become the mainstream of development. Generally, at the beginning of forming fin FETs, trenches are formed in a semiconductor substrate by at least a patterning process, such as a photolithograph-etching process (PEP), to transfer the layout pattern to the semiconductor substrate and a plurality of fin structures are defined in the semiconductor substrate by the trenches. The trenches are then filled with an insulating dielectric material to form an isolation structure between the fin structures. A fin recess process is performed to recess the insulating dielectric material to expose the top surface and the upper sidewall of the fin structures. Afterward, a gate process is performed to form the gate structures striding across the fin structures, wherein the overlapping regions of the fin structures and the gate structures are the channel regions of the fin FETs.

It is well-known in the art that stresses such as compressive stress and tensile stress may have influences on device performance. A certain type of stress is usually applied on the devices by forming, for example, strained silicon in the source/drain region, or forming stressor layers such as a spacer layer or a contact etching stop layer (CESL) comprising proper stress directly covering the gate structure. A better performance of the devices is also earnestly demanded in the development of advanced technology as the trend of dimension minimization continues. Therefore, there is still a need in the field to provide a device having a further improved performance.

SUMMARY OF THE INVENTION

One objective of the present invention is to provide a CMOS device. According to one embodiment of the invention, the CMOS device includes a substrate, an isolation structure on the substrate. A plurality of active regions are formed on the substrate and penetrating through the isolation structure. The active regions are arranged end-to-end along a first direction and have a length extending along the first direction. A pair of first gate structures are formed on the active region and covering the two terminals of the active region. Each first gate structure has an inner edge striding across the active region and an outer edge completely lying on the isolation structure. At least a second gate structure is formed between the pair of first gate structures and striding across the active region between the first gate structures. A plurality of recessed regions are formed in the isolation structure and are arranged in alternation with the active regions along the first direction, wherein each of the recessed regions is disposed between the adjacent terminals of each pair of neighboring active regions and abutting the outer edge of the first gate structure. An interlayer dielectric layer covers the isolation structure, the active regions, the first gate structures and the second gate structure and fills up the recessed region, wherein the interlayer dielectric layer comprises a stress.

Another objective of the present invention is to provide a method for forming a CMOS device including the steps of providing a substrate; forming a plurality of active regions arranged end-to-end along a first direction on the substrate, wherein each of the active regions has a length extending along the first direction; forming an isolation structure on the substrate, surrounding and isolating each of the active regions; forming a pair of first gate structures and at least a second gate structure between the pair of first gate structures on each active region, wherein the pair of first gate structures cover the two terminals of the active region respectively, the second gate structure strides across the active region between the pair of first gate structures; forming a mask layer covering the isolation structure, the active region, the first gate structure and the second gate structure, wherein the mask layer comprises a plurality of openings arranged along the first direction and exposing a portion of the isolation structure between the adjacent terminals of each pair of neighboring active regions; performing an etching process to remove a portion of the isolation structure from the openings thereby forming a plurality of recessed region in the isolation structure; removing the mask layer; and forming an interlayer dielectric layer covering the isolation structure, the active region, the first gate structure and the second gate structure and filling up the recessed regions.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
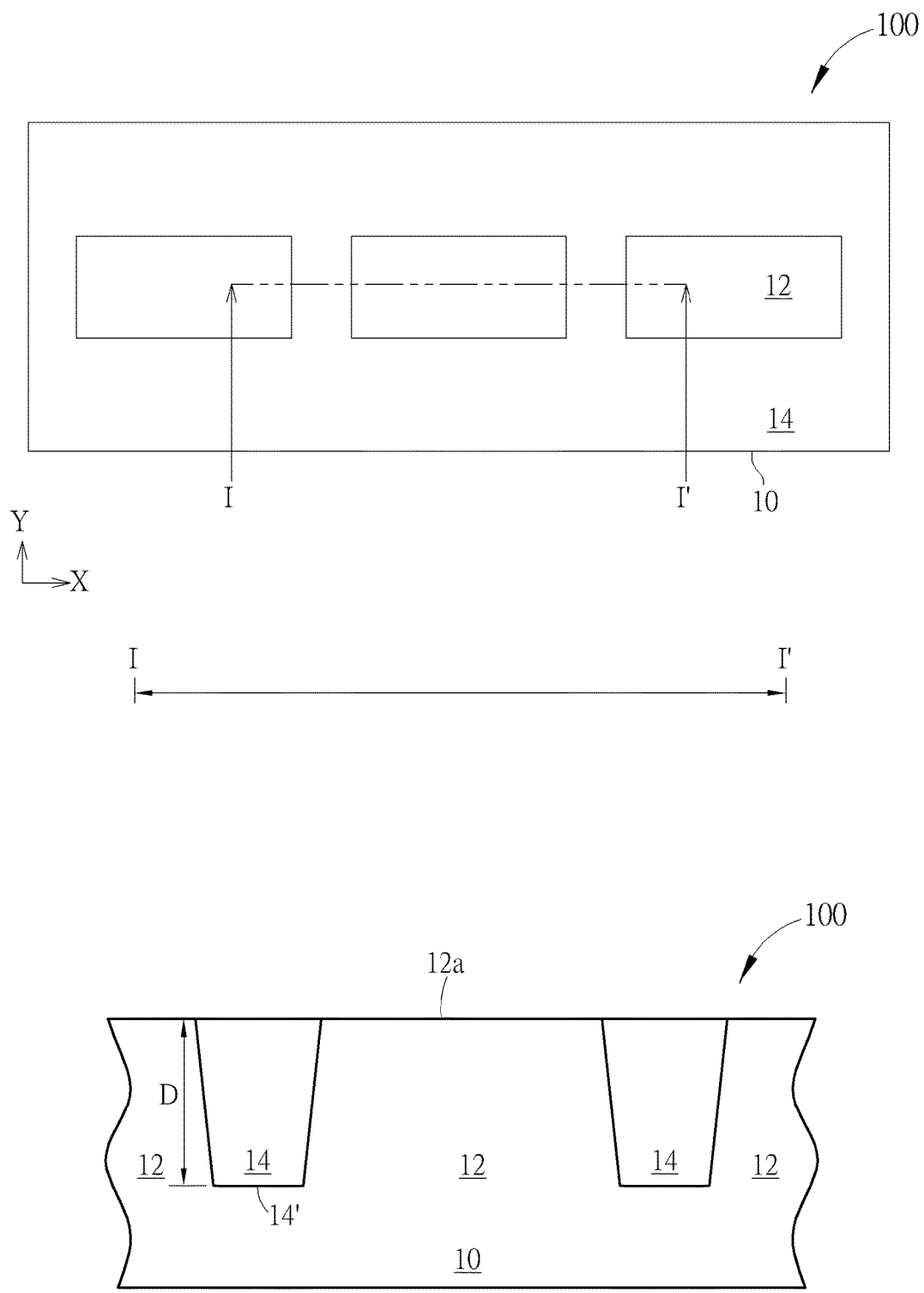
FIG. 1 to FIG. 7 are schematic diagrams illustrating the steps of forming a CMOS device according to one embodiment of the present invention. The upper portion of each diagram is the top view of the CMOS device, and the lower portion of each diagram is the correspondent cross-sectional view taken along the line I-I' in the top view.

In the following description, numerous specific details are given to provide a thorough understanding of the invention. It will, however, be apparent to one skilled in the art that the invention may be practiced without these specific details. Furthermore, some system configurations and process steps are not disclosed in detail, as these should be well-known to those skilled in the art. Other embodiments may be utilized, and structural, logical, and electrical changes may be made without departing from the scope of the present invention.

The drawings showing embodiments of the apparatus are semi-diagrammatic and not to scale, and some dimensions are exaggerated in the figures for clarity of presentation.

Where multiple embodiments are disclosed and described as having some features in common, like or similar features will usually be described with like reference numerals for ease of illustration and description thereof.

Please refer to FIG. 1. A substrate 10 is provided. A plurality of active regions 12 are formed on the substrate 10 and separated by an isolation structure 14. The active region 12 has a length extending along a first direction X, and the plurality of active regions 12 are arranged end-to-end along the first direction X. The active regions 12 may be formed by performing a multiple patterning process. For example, a first patterning process is performed to pattern the substrate 10, forming an isolation trench 14' in the substrate 10 and defining at least a contentious fin structure by the isolation trench 14'. Subsequently, a second patterning process is performed to form the active regions 12 by dividing the contentious fin structure into a plurality of discrete segments. After that, a dielectric material, such as silicon oxide, is deposited on the substrate 10 and completely covering the active regions 12 and filling up the isolation trench 14'. A planarization process is performed to remove the excess dielectric material outside the isolation trench 14' until the top surface 12a of the active region 12 is exposed. The dielectric material remaining in the isolation trench 14' therefore becomes the isolation structure 14. A depth D of the isolation trench 14' is provided herein for a better understanding of the relative depths of different features of the present invention and should not be taken as a limitation of the present invention. According to one embodiment of the present invention, the depth of the isolation trench 14' is around 1200 angstroms.

Figure 2:
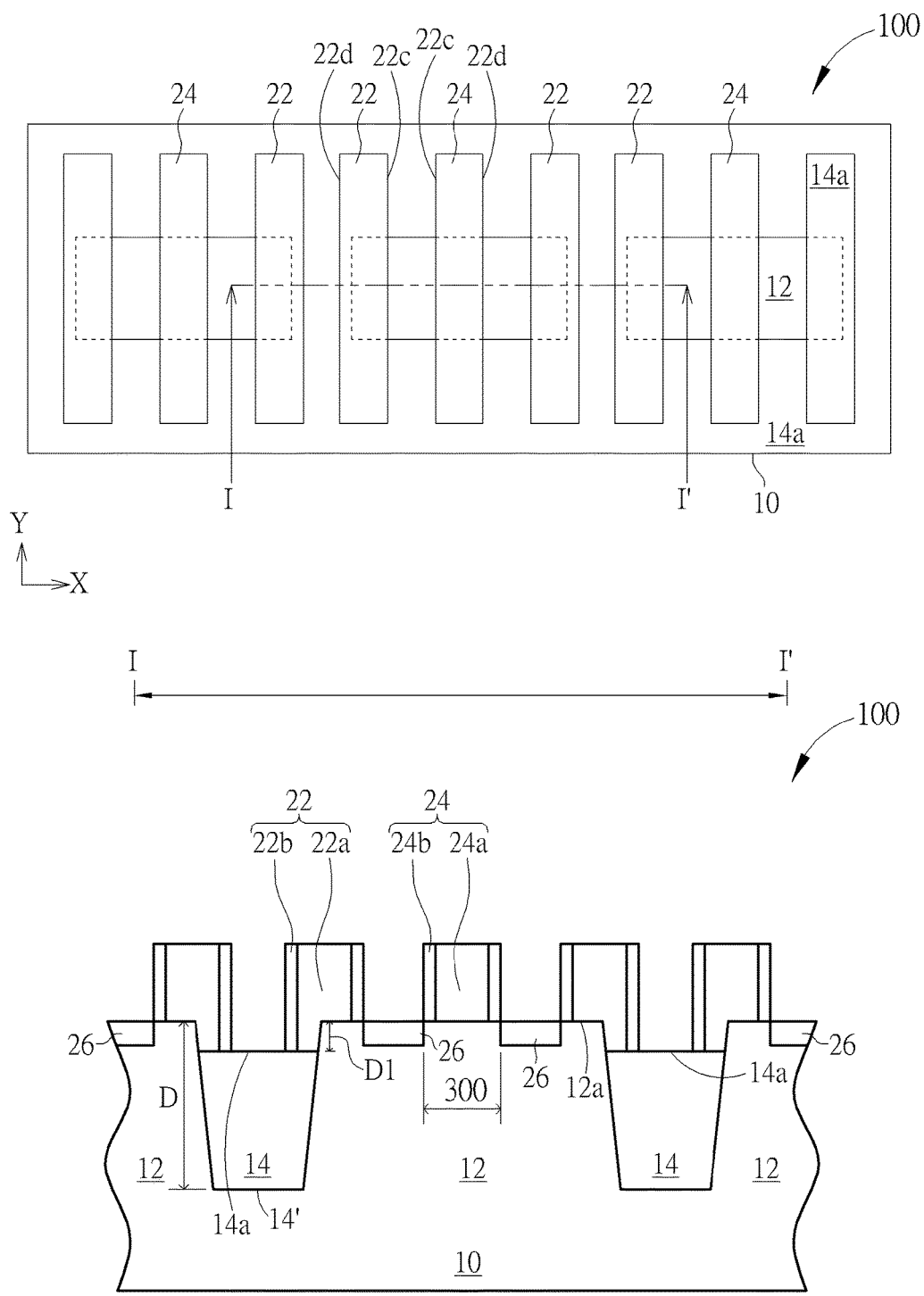

Please refer to FIG. 2. A pair of first gate structures 22 are formed on each active region 12 and covering the two terminals of the active region 12. The first gate structure 22 has a length extending along a second direction Y perpendicular to the first direction X. At least a second gate structure 24 is formed between the pair of first gate structures 22. The second gate structure 24 has a length extending along the second direction Y and striding across the active region 12 between the first gate structures. As shown in FIG. 2, the first gate structure 22 has a gate electrode 22a and a spacer 22b on each side of the gate electrode 22a. The second gate structure 24 has a gate electrode 24a and a spacer 24b on each side of the gate electrode 24a. The first gate structure 22 has an inner edge 22c striding across the active region 12 and an outer edge 22d completely lying on the isolation structure 14. The first gate structure 22 and the second gate structure 24 may be formed by the same process. For example, after forming the active region 12 and the isolation structure 14 and finishing well implantation process, a gate material, such as poly silicon, is deposited on the substrate 10. The gate material is then patterned into the gate electrodes 22a and 24a. Subsequently, a spacer material layer is conformally formed on the substrate 10 and covering the gate electrode 22a and 24a. An anisotropic etching process is then performed to etch away some of the spacer material and leave the spacer material only remaining on the sidewall of the gate electrodes 22a and 24a, thereby obtaining the spacers 22b and 24b. The spacer material may comprise silicon oxide or silicon nitride, or other suitable materials. The spacers 22b and 24b may be formed with single layer structure or multilayer structure by depositing single spacer material layer or multiple spacer material layers. According to one embodiment of the present invention wherein a finFET is to be formed, an etching back step is performed to blanketly remove a thickness of the isolation structure 14 before depositing the gate material. After the etching back step, the isolation structure 14 is recessed to a level having a top surface 14a below the top surface 12a of the active region 12, a top portion of the active region 12 is therefore protruding from the top surface 14a of the isolation structure 14 and a sidewall portion of the active region 12 is exposed. After the etching back step, the gate material is deposited on the isolation structure 14 and covering the top surface 12a and the exposed sidewall portion of the active region 12. The gate material is then patterned into the gate electrodes 22a and 24a. Consequently, as shown in FIG. 2, the gate electrodes 22a and 24a are formed striding across the active region 12, covering a portion of the isolation structure 14 and interfacing with the isolation structure 14 on the top surface 14a of the isolation structure 14. The top surface 14a of the isolation structure 14 is lower than the top surface 12a of the active region 12 in a depth D1. The depth D1 is preferably about one third (⅓) of the depth D of the isolation trench 14'. For example, when the depth D of the isolation trench 14' is 1200 angstroms, the depth D1 is approximately 440 angstroms. It should be understood that in other embodiments wherein a planar FET is to be formed, the etching back step may be omitted. The top surface 14a of the isolation structure 14 may be leveling with, higher or lower than the top surface 12a of the active region 12.

Figure 3:
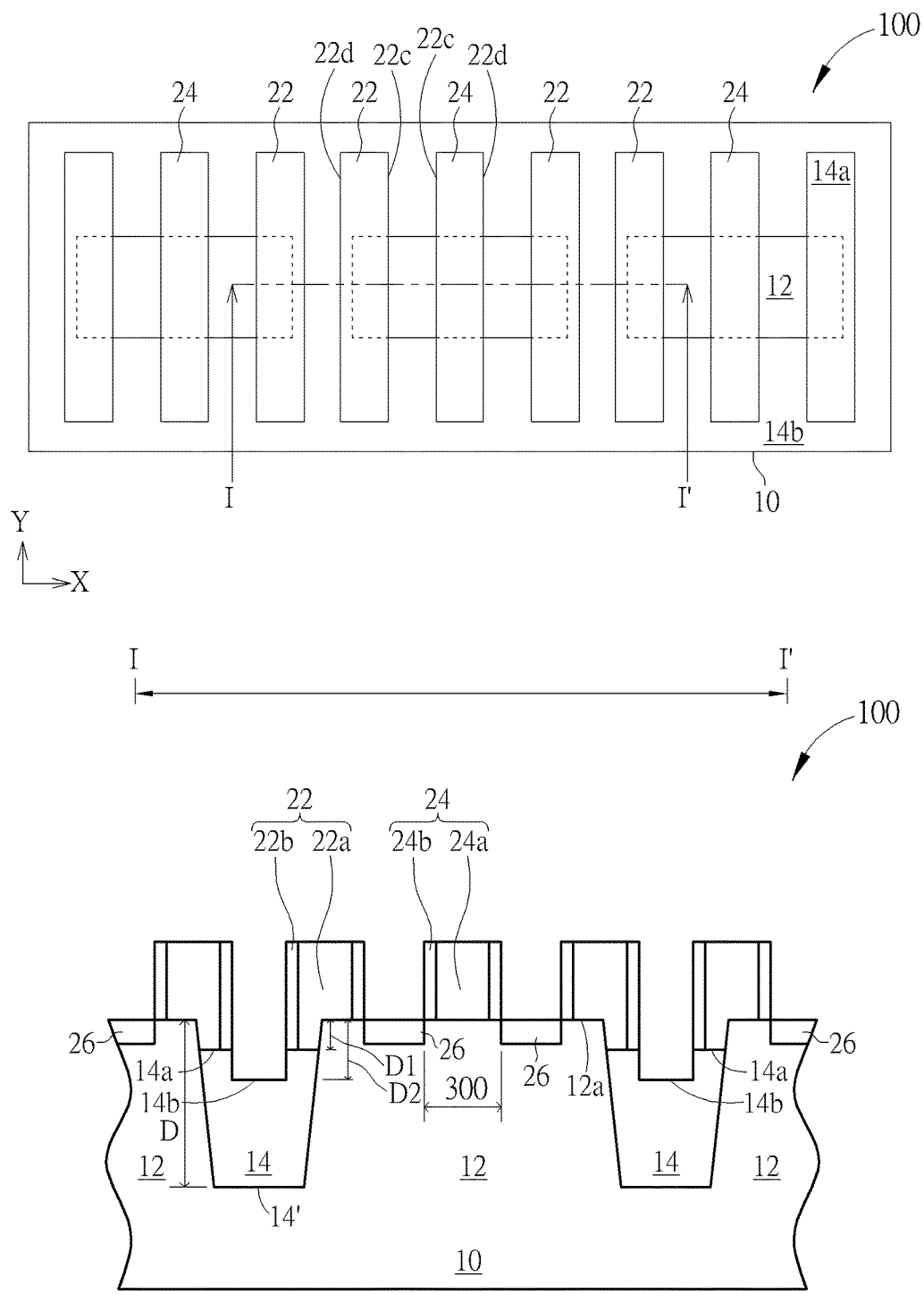

Please refer to FIG. 3. A source/drain region 26 is then formed in the active region 12 at each side of the second gate structure 24. The active region 12 between the source/drain regions 26 and overlapped by the second gate structure 24 is the channel region 300. The source/drain region 26 may be a doped region formed by at least one ion implantation process or preferably by epitaxial growth process. It is noticeable that the isolation structure 14 exposed from the gate electrodes 22a and 24a may further lose a thickness by being etched by the dry etchants, wet etchants or cleaning solutions used after forming the gate electrodes 22a and 24a to the stage the source/drain regions 26 are formed. That is, the isolation structure 14 not covered by the gate electrodes 22a and 24a may be etched from the top surface 14a to a lower top surface 14b having a depth D2 below the top surface 12a of the active region 12. According to one embodiment of the present invention, the overall lost thickness of the isolation structure 14 not covered by the gate electrodes 22a and 24a is approximately 240 angstroms. In other words, the depth D2 is approximately 680 angstroms. In other embodiments, the lost thickness of the isolation structure 14 may be alleviated by using etchants or cleaning solutions having smaller etching rate for the isolation structure 14. When the lost thickness is so small that the depth D2 is almost the same as the depth D1, the top surface 14b of the isolation structure 14 is considered leveling with the top surface 14a of the isolation structure 14.

Figure 4:
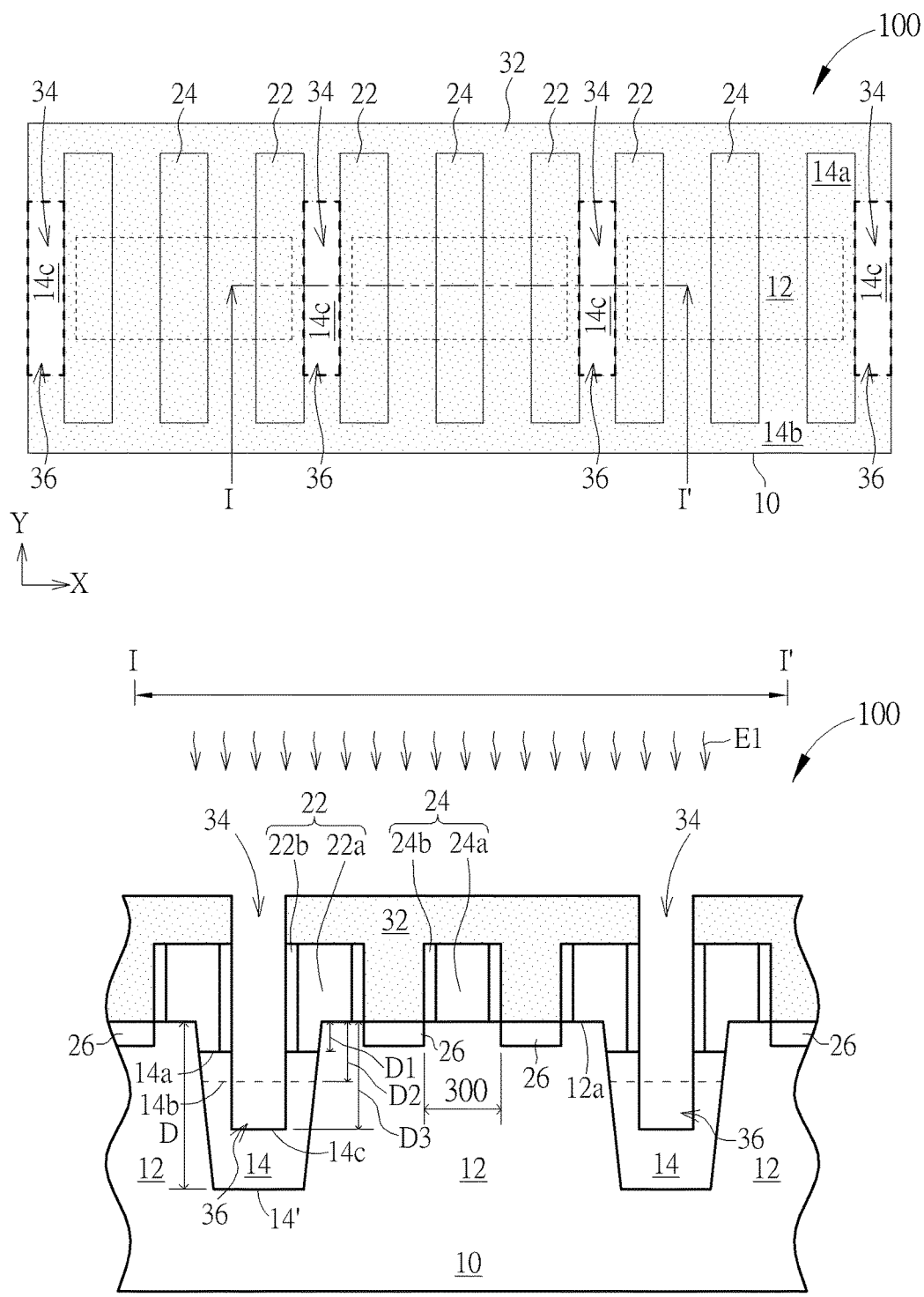

Please refer to FIG. 4. After forming the source/drain regions 26, an anneal process, such as a rapid thermal process (RTP) may be performed to activate the dopants in the source/drain regions 26 and repair the crystal defects of the active regions 12. Subsequently, a mask layer 32 is formed on the entire substrate 10 and covers the first gate structure 22, the second gate structure 24, the active region 12 and the isolation structure 14. The mask layer 32 is formed in direct contact with the isolation structure 14 and interfacing with the isolation structure 14 on the top surface 14b of the isolation structure 14. The mask layer 32 may be a photoresist layer. A plurality of openings 34 are formed in the mask layer 32. In the top view structure shown in the upper portion of FIG. 4, the openings 34 are arranged in alternation with the active regions 12 along the first direction X. Each opening 34 is aligned vertically over the isolation structure 14 between the adjacent terminals of each pair of neighboring active regions 12 to expose a portion of the top surface 14b of the isolation structure 14. Preferably, the width of the opening 34 is equal or wider than the space between the outer edges 22a of the first gate structures 22 respectively covering the adjacent terminals, and is smaller than the space between the adjacent terminals of the neighboring active regions 12. Therefore, the outer edges 22d of the first gate structures 22 on the adjacent terminals of the neighboring active regions 12 are exposed from the opening 34. An etching process E1 is performed and using the mask layer 34 and the first gate structure 22 as etching masks to etch away a portion of the isolation structure 14 from the openings 34, thereby forming a plurality of recessed regions 36 between the adjacent terminals of the active regions 12. The etching process E1 substantially recesses the isolation structure 14 from the top surface 14b exposed from the opening 34 to a level lower than the top surface 12a of the active region 12 in a depth D3. The depth D3 is larger than D1 and D2. Preferably, the depth D3 is equal or larger than two third (⅔) of the depth D of the isolation trench 14'. For example, in the embodiment wherein the depth D of the isolation trench 14' is approximately 1200 angstroms, the depth D3 is preferably larger than 800 angstroms. In another embodiment the etching process E1 substantially etches through the whole thickness of the isolation structure 14 exposed from the opening 34. As a result, a bottom surface of the isolation trench 14' is exposed.

Figure 5:
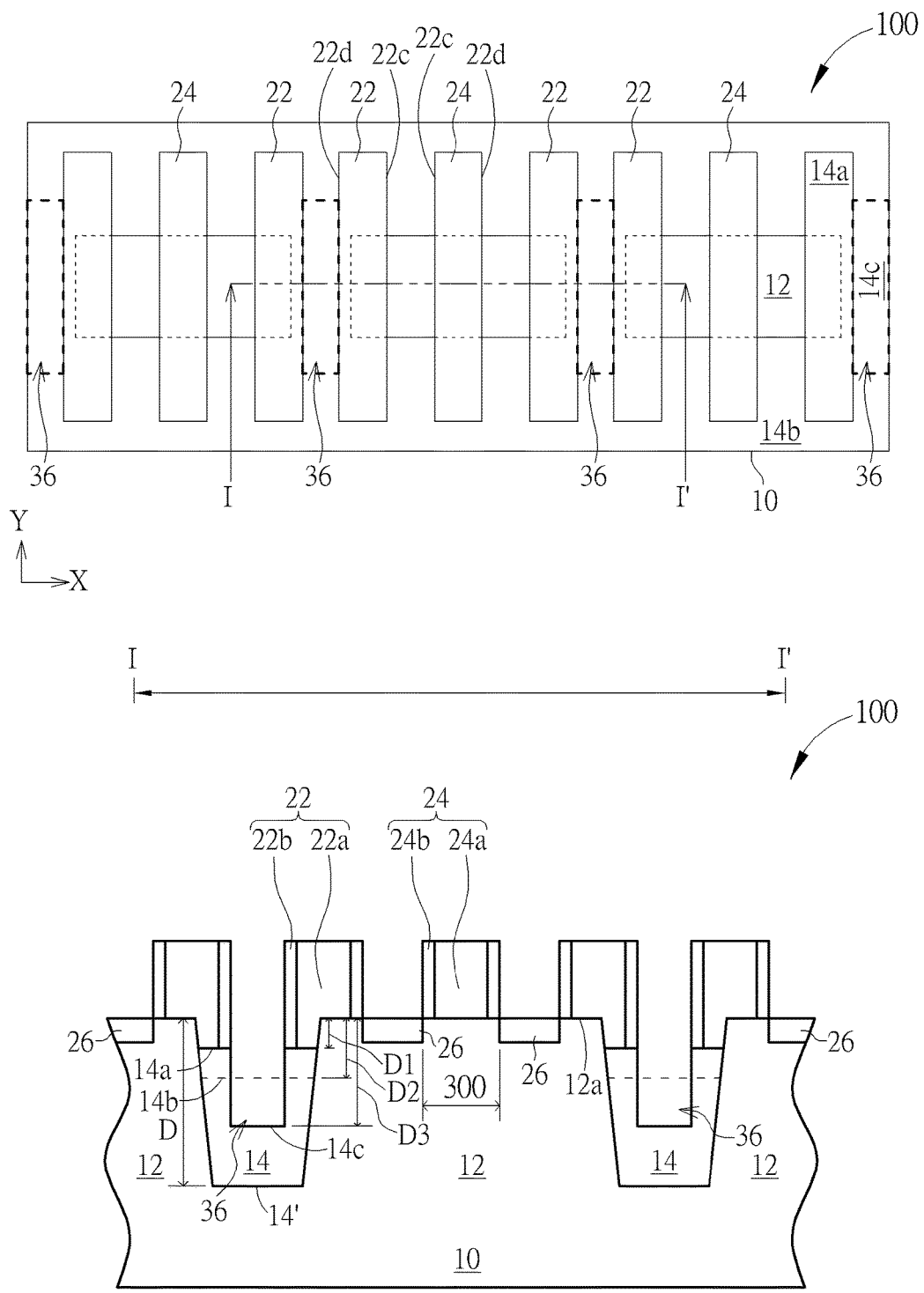

Please refer to FIG. 5. After forming the recessed regions 36, the mask layer 32 is completely removed. The active region 12, the first gate structure 22, the second gate structure 24, the top surface 14b of the isolation structure 14 and the bottom surface 14c of the recessed region 36 are revealed. The top surface 14a of the isolation structure 14 is still overlapped by the first gate structure 22 and the second gate structure 24 and is not exposed. As shown in FIG. 5, the recessed region 36 is formed between the adjacent terminals of each pair of neighboring active regions 12. The recessed regions 36 and the active regions 12 are arranged in alternation along the first direction X. The recessed region 36 is formed in the isolation structure 14 and the perimeter if the recessed region 36 is completely surrounded by the top surface 14a (covered by the first gate structure 22 and the second gate structure 24) and the top surface 14b of the isolation structure 14. Preferably, the etching process E1 has etching selectivity between the first gate structure 22 and the isolation structure 14. In this way, it is possible to form the recessed region 36 self-aligned with the outer edge 22d of the first gate structure 22 without damaging any portion of the first gate structure 22. As shown in the lower portion of FIG. 5, the sidewall of the recessed region 36 is vertically aligned with the sidewall of the outer edge 22d of the first gate structure 22.

Figure 6:
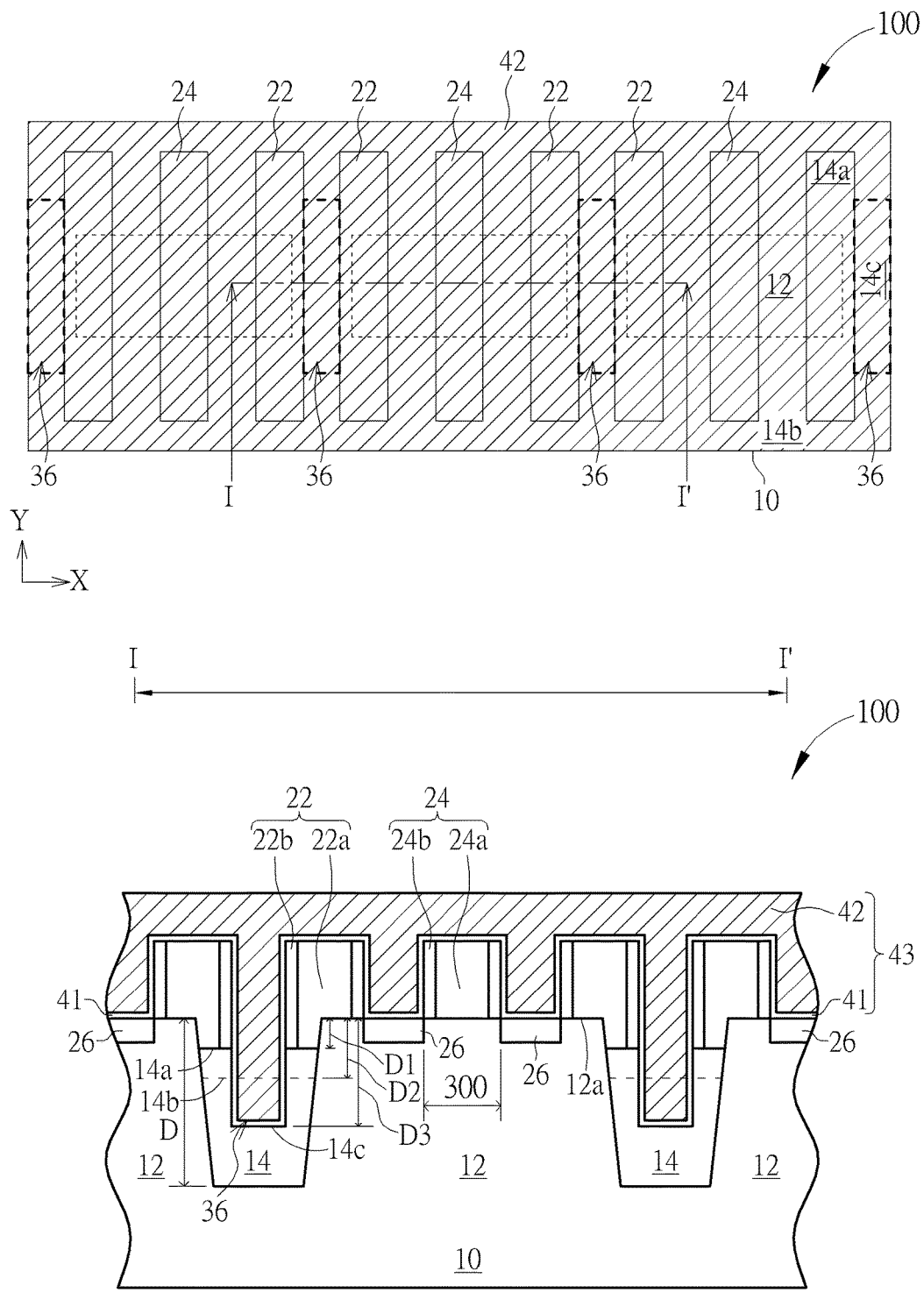

Please refer to FIG. 6. Subsequently, an interlayer dielectric layer 43 is formed on the entire substrate 10 and covering the isolation structure 14, the active region 12, the first gate structure 22 and the second gate structure 24 and filling up the recessed region 36. A planarization process, such as a chemical mechanical polishing (CMP) process or an etching back process is performed to remove the excess interlayer dielectric layer 43 until a polished planar top surface of the interlayer dielectric layer 43 is obtained. The interlayer dielectric layer 43 is in direct contact with the isolation structure 14 on the top surface 14b of the isolation structure 14 and the bottom surface 14c of the recessed region. The interlayer dielectric layer 43 may comprise an etching stop layer 41 conformally covering the isolation structure 14, the recessed region 36, the active region 12, the first gate structure 22 and the second gate structure 24, and a dielectric layer 42 blanketly deposited on the etching stop layer 41 and filling up the recessed regions 36 and the spaces between the first gate structures 22 and the second gate structures 24. The material of the etching stop layer 41 may be silicon oxide, silicon glass, silicon nitride, silicon carbon nitride or silicon oxy nitride, but not limited hereto. The material of the dielectric layer 42 may be silicon oxide, silicon glass, silicon nitride, silicon carbon nitride or silicon oxy nitride, but not limited hereto. Preferably, the etching stop layer 41 and the dielectric layer 42 are formed by different materials for being used as an etching stop layer during the process of forming contact plugs. It is one feature of the present invention that the dielectric layer 42 is formed having a stress S1. For example, the dielectric layer 42 is formed by performing a flowable chemical vapor deposition (FCVD) process, wherein the stress S1 is obtained after a post-deposition anneal process. The type of the stress S1 is determined according to device's needs. For example, when the channel region 300 of the CMOS device 100 is an N-type channel, the dielectric layer 42 is preferably formed having a tensile stress. On the contrary, when the channel region 300 of the CMOS device 100 is a P-type channel, the dielectric layer 42 is preferably formed having a compressive stress. In a more preferred embodiment, the contact etching stop layer 41 may also comprise a certain stress S2. The stress S1 and the stress S2 may be the same type (both are tensile or compressive) or different types (one is tensile while the other one is compressive). By adjusting and the stress S1 of the dielectric layer 42 and the stress S2 of the contact etching stop layer 41, an optimized overall stress for the channel region 300 of the CMOS device may be obtained. It should be noticed that, the overall stress of the stress S1 and the stress S2 is preferably a tensile stress for an N-type channel and a compressive stress for a P-type channel.

In one embodiment wherein the CMOS device 100 comprises poly silicon gate, a thickness of the interlayer dielectric layer 43 is remained covering the top surface of the first gate structure 22 and the second gate structure 24 after the planarization process, as shown in FIG. 6. Subsequent process is then carried out to form other structures such as contact plugs (not shown) and metal interconnection structures (not shown). The interlayer dielectric layer 43 in the structure shown in FIG. 6 completely covers the active region 12 and the isolation structure 14. The interlayer dielectric layer 43 is allowed to fill into a deeper region between the terminals of the neighboring active regions 12 by forming the recessed region 36, and is therefore able to provide the stress more effectively to the channel region 300 of the CMOS device 100, especially to provide stress along the length direction (current direction) of the channel region 300.

Figure 7:
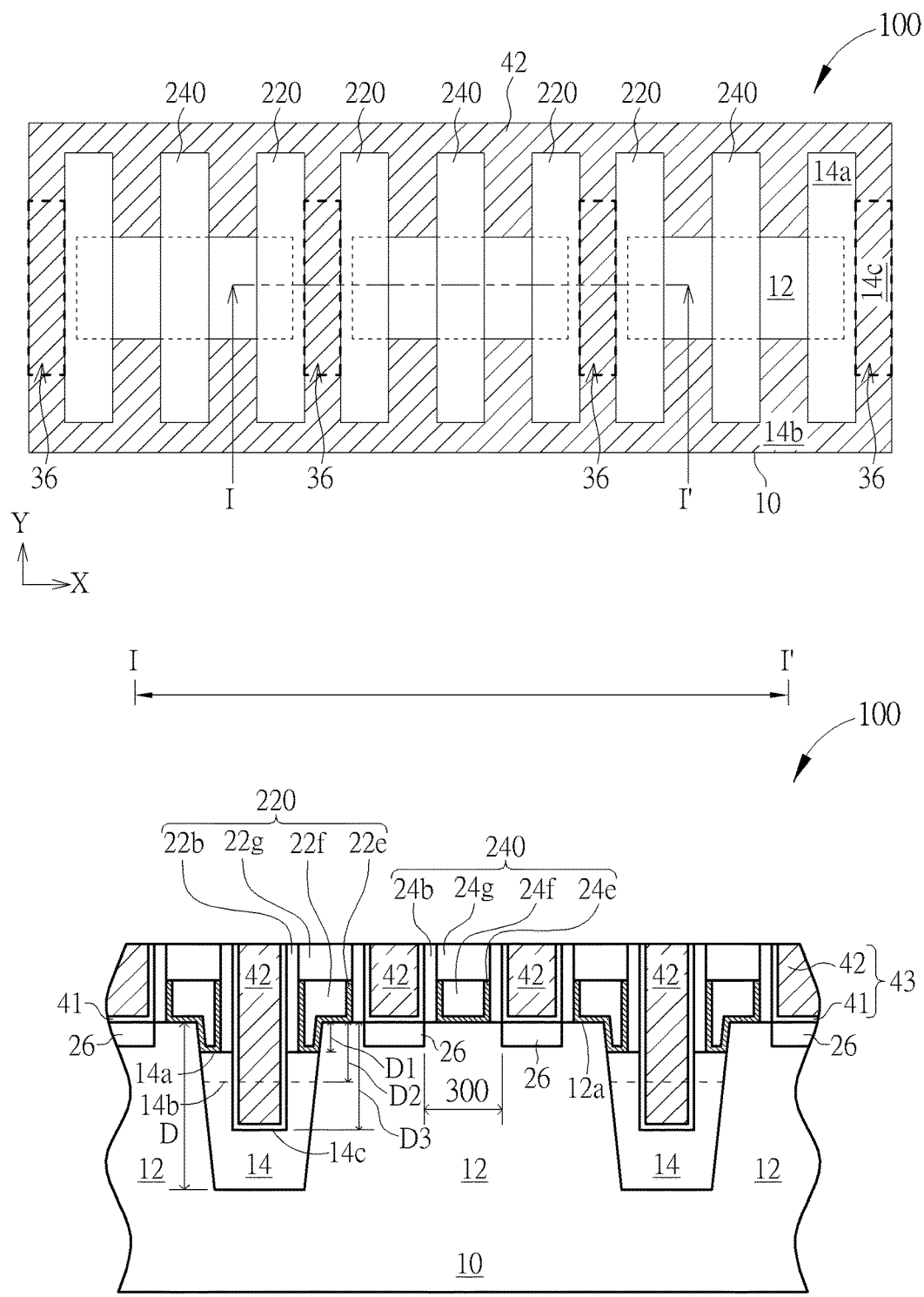

Please refer to FIG. 7. In another embodiment wherein the CMOS device 100 comprises metal gate, a replacement metal gate process may be performed after planarizing the interlayer dielectric layer 43. For example, the interlayer dielectric layer 43 shown in FIG. 6 is further polished or etched until the top surfaces of the gate electrodes 22a and 24a are exposed. The exposed gate electrodes 22a and 24a are then removed to form gate trenches. Subsequently, a high-k dielectric layers is formed conformally covering the interlayer dielectric layer 43 and along the sidewall and bottom of the gate trenches. A metal layer is deposited on the high-k dielectric layer, covering the entire interlayer dielectric layer 43 and filling up the gate trenches. A polishing process is then performed to remove the excess high-k dielectric layer and the metal layer outside the gate trenches. The high-k dielectric layer and metal layer remaining in the gate trenches become the high-k dielectric layers 22e, 24e and metal gate electrodes 22f, 24f respectively. The metal gate electrodes 22f and 24f are etched back to a predetermined depth and the cap layers 22g and 24g are formed on the metal gate electrodes 22f and 24f to fill the gate trenches. The cap layer 22g and 24g may serve as a protection layer for the gate electrode 22f and 24f respectively. In the structure show in FIG. 7, the interlayer dielectric layer 43 also fills into a deeper region between the terminals of the neighboring active regions 12 by forming the recessed region 36, and is therefore able to provide stress to the channel region 300 of the CMOS device 100 more effectively. More particularly, the recessed region 36 provides an access for the interlayer dielectric layer 43 to provide stress to the channel region 300, especially more effectively on the length direction (current direction) of the channel 300.

Figure 8:
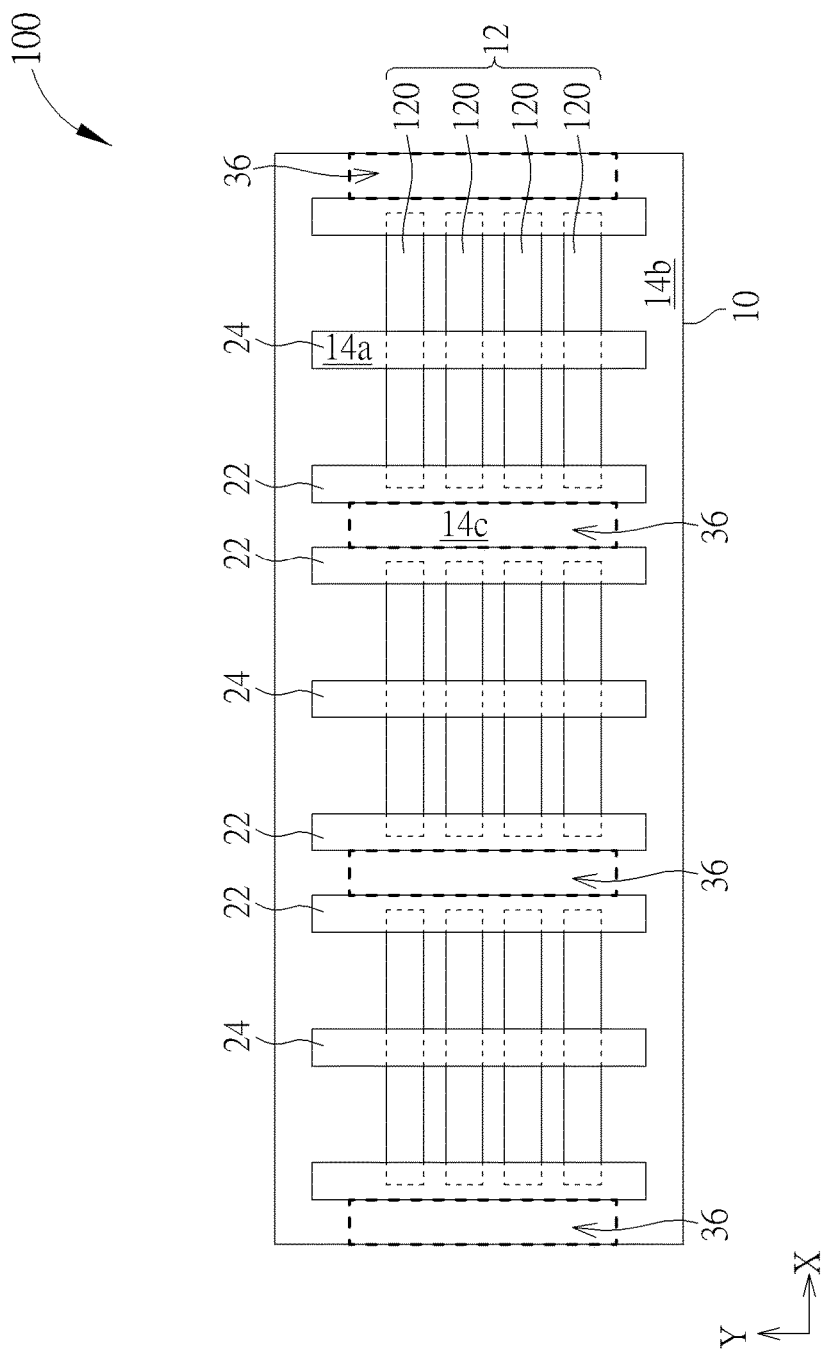
FIG. 8 illustrates another embodiment of the present invention.

Please refer to FIG. 8, which shows a top view structure of the CMOS device according to another embodiment of the present invention. The active region 12 shown in FIG. 8 comprises multiple mutually parallel sub-active regions 120. Each sub-active region 120 also extends along the first direction X. The sub-active regions 120 are separated by the isolation structure 14. A pair of the first gate structure 22 extends along the second direction Y beyond the outermost edge of the sub-active regions 120 to cover the group of terminals aligned along the second direction Y. The second gate structure 24 also extends along the second direction Y beyond the outermost edge of the sub-active regions 120 to stride across the group of sub-active regions 120 between each pair of first gate structures 22. The recessed region 36 shown in FIG. 8 also extends along the second direction Y beyond the outermost edge of the sub-active regions 120 to interpose between each pair of the adjacent terminals covered by the pair of the first gate structure 22. The interlayer dielectric layer 43 formed in later processes also fills into a deeper region between the terminals of the sub-active regions 120 and is able to provide stress to the channel region more effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A complementary metal oxide semiconductor (CMOS) device, comprising: a substrate; an isolation structure formed on the substrate; a plurality of active regions arranged end-to-end along a first direction on the substrate and penetrating through the isolation structure, wherein each of the active regions has a length extending along the first direction; a pair of first gate structures disposed on each active region and covering two terminals of the active region, wherein the first gate structure comprises an inner edge striding across the active region and an outer edge completely lying on the isolation structure; at least a second gate structure disposed between the pair of the first gate structures and striding across the active region; a plurality of recessed regions formed in the isolation structure and arranged alternately with the active regions along the first direction, wherein each of the recessed regions is disposed between the adjacent terminals of each pair of neighboring active regions and abutting the outer edge of the first gate structure; and an interlayer dielectric layer directly covering the isolation structure, the active regions, the first gate structures and the second gate structure and filling up the recessed region, wherein the interlayer dielectric layer comprises a stress.

2. The CMOS device according to claim 1, wherein the active region overlapped under the second gate structure comprises a channel region.

3. The CMOS device according to claim 2, wherein the channel region is an N-type channel region and the stress of the interlayer dielectric layer is a tensile stress.

4. The CMOS device according to claim 2, wherein the channel region is a P-type channel region and the stress of the interlayer dielectric layer is a compressive stress.

5. The CMOS device according to claim 1, wherein the isolation structure has a first top surface interfaced with the first gate structure and the second gate structure and a second top surface interfaced with the interlayer dielectric layer.

6. The CMOS device according to claim 5, wherein the second top surface levels with or is lower than the first top surface.

7. The CMOS device according to claim 5, wherein the recessed region has a bottom surface lower than the second top surface.

8. The CMOS device according to claim 5, wherein the interlayer dielectric layer is in direct contact with the second top surface of the isolation structure.

9. The CMOS device according to claim 5, wherein the recessed region is completely surrounded by the first top surface and the second top surface.

10. The CMOS device according to claim 1, wherein the recessed region and the first gate structure have vertically aligned sidewalls.

11. A method for forming a complementary metal oxide semiconductor (CMOS) device, comprising: providing a substrate; forming a plurality of active regions arranged end-to-end along a first direction on the substrate, wherein each of the active regions has a length extending along the first direction; forming an isolation structure on the substrate, surrounding and isolating each of the active regions; forming a pair of first gate structures and at least a second gate structure between the pair of first gate structures on each active region, wherein the pair of first gate structures cover two terminals of the active region respectively, the second gate structure strides across the active region between the pair of first gate structures; forming a mask layer covering the isolation structure, the active region, the first gate structure and the second gate structure, wherein the mask layer comprises a plurality of openings arranged along the first direction and exposing a portion of the isolation structure between the adjacent terminals of each pair of neighboring active regions; performing an etching process to remove a portion of the isolation structure from the openings thereby forming a plurality of recessed region in the isolation structure; removing the mask layer; and forming an interlayer dielectric layer covering the isolation structure, the active region, the first gate structure and the second gate structure and filling up the recessed regions.

12. The method for forming a CMOS device according claim 11, wherein the first gate structure comprises an inner edge striding across the active region and an outer edge completely lying on the isolation structure.

13. The method for forming a CMOS device according claim 12, wherein the outer edge of the first gate structure is exposed from the opening of the mask layer.

14. The method for forming a CMOS device according claim 13, wherein the recessed region is formed self-aligned with the outer edge of the first gate structure.

15. The method for forming a CMOS device according claim 11, wherein the first gate structure and the second gate structure covers a first top surface of the isolation structure.

16. The method for forming a CMOS device according claim 15, wherein the mask layer is formed directly interfacing a second top surface of the isolation structure, wherein the second top surface levels with or is lower than the first top surface of the isolation structure.

17. The method for forming a CMOS device according claim 16, wherein the etching process is performed on the second top surface exposed from the openings of the mask layer.

18. The method for forming a CMOS device according claim 16, wherein the interlayer dielectric layer is formed directly interfacing the second top surface of the isolation structure.

19. The method for forming a CMOS device according claim 11, further comprising forming a source/drain region in the active region at each side of the second gate structure before forming the mask layer.

20. The method for forming a CMOS device according claim 11, wherein the interlayer dielectric layer is formed by a flowable chemical vapor deposition (FCVD) process and comprises a stress.

* * * * *